(12) United States Patent
Bryant

(10) Patent No.: US 6,532,683 B1
(45) Date of Patent: *Mar. 18, 2003

(54) DRYING METHOD FOR WOVEN GLASS FABRIC

(75) Inventor: Michael I. Bryant, Thomasville, NC (US)

(73) Assignee: BGF Industries, Inc., Greensboro, NC (US)

( * ) Notice: Subject to any disclaimer, the term of this patent is extended or adjusted under 35 U.S.C. 154(b) by 96 days.

This patent is subject to a terminal disclaimer.

(21) Appl. No.: 09/838,796

(22) Filed: Apr. 20, 2001

(51) Int. Cl.[7] .................................................. F26B 3/34
(52) U.S. Cl. ......................... 34/256; 34/246; 34/257; 34/258; 34/381; 34/308; 34/399; 219/701; 156/379.6; 427/543
(58) Field of Search .......................... 34/255, 246, 256, 34/257, 258, 380, 381, 308, 398, 399, 400; 219/701, 705; 156/275.3, 379.6, 379.8, 555; 427/543, 388.1, 391, 393

(56) References Cited

U.S. PATENT DOCUMENTS

| | | | |
|---|---|---|---|
| 4,365,422 A | 12/1982 | Kawaguchi | |
| 4,412,388 A | 11/1983 | Takagi et al. | |
| 4,859,821 A | 8/1989 | Meyer et al. | |
| 5,443,611 A | * 8/1995 | Salvador et al. | 65/507 |
| 5,536,921 A | 7/1996 | Hedrick et al. | |
| 5,795,365 A | * 8/1998 | Salvador et al. | 65/443 |
| 5,813,134 A | 9/1998 | Min et al. | |
| 5,859,412 A | 1/1999 | Yagi | |
| 5,958,275 A | 9/1999 | Joines et al. | |
| 5,979,073 A | 11/1999 | Fuls et al. | |
| 5,981,022 A | 11/1999 | Min et al. | |
| 5,998,774 A | 12/1999 | Joines et al. | |
| 6,075,232 A | 6/2000 | Joines et al. | |
| 6,087,642 A | 7/2000 | Joines et al. | |
| 6,121,594 A | 9/2000 | Joines et al. | |
| 6,192,599 B1 | 2/2001 | Bryant et al. | |

\* cited by examiner

Primary Examiner—Pamela Wilson
(74) Attorney, Agent, or Firm—Womble Carlyle Sandridge & Rice, PLLC

(57) ABSTRACT

A process for the drying of woven glass fabric to be used in a reinforcing laminate in sensitive electronic equipment is disclosed. The process implements a drying technique utilizing microwave energy for drying.

10 Claims, 4 Drawing Sheets

DRYING METHOD FOR WOVEN GLASS FABRIC

FIELD OF THE INVENTION

The present invention generally relates to the production of woven glass fabrics and particularly to the drying of woven glass fabrics for use as a substrate for printed circuit boards.

BACKGROUND

Laminated circuit boards are used widely in sensitive electronic equipment such as computers and communications equipment. Circuit boards, generally, are multi-layer composites of thermosetting polymers and suitable reinforcing materials. One suitable reinforcing material is one or more layers woven glass fabric.

Such reinforcing fabrics are extremely fine, lightweight and very fragile. During processing, the fabric is particularly susceptible to picking up residue or particulate matter that, if conductive and not removed, may cause performance malfunctions (such as short circuits) in the finished printed circuit boards. Due to such sensitivity, high standards of cleanliness and quality are imposed. Fabrics commonly are rejected if the fabrics are contaminated with any foreign particles, whether conductive or not.

Heretofore, during finishing, and often the application of the selected finishing fluid, such fabrics have been dried using hot air, contact heat, or infrared radiation. Such drying techniques are acceptable for ordinary applications in which deposits of some foreign particulate matter will not adversely affect the product or may be washed out after subsequent operations. However, these techniques have proved to be unsatisfactory where the fabric is used in the manufacture of printed circuit boards. Hot air, contact heat, and/or infrared radiation techniques are prone to leave too many fine particles that may contaminate the woven glass fabric to an unacceptable level. Hot air introduces a foreign fluid stream that is riddled with particulate matter. Contact heat can cause migration from one face of the fabric to another and results in uneven and non-uniform drying. Infrared radiation cannot be controlled sufficiently; therefore a mechanical shutter system must be used to prevent excessive heating of the fabric. The shutter system introduces rust, dirt, and other particulate matter to the fabric environment. Further, some fiberglass fabric finishes are heat sensitive and are often damaged during these harsh drying processes.

Drying of fiberglass fabric used as substrates in printed circuit boards by radio frequency waves in the range of 40 MHz has been suggested, but this itself raises certain problems. First, electrodes must be spaced or "tuned" for each application. Secondly, the use of spaced electrodes can cause sporadic arcing which results in holes being burned in the fabric and shuts down the production line. There is uneven drying of the fabric with the edges drying last. Also, the differences between the electrical loss tangent for various finishes in radio frequency is significant and can adversely affect the drying rate.

SUMMARY OF THE INVENTION

The present invention is a process for the manufacture of woven glass fabric to be used in sensitive electronic equipment. The process adopts a drying technique in which the woven glass fabric is subjected to electromagnetic radiation in the microwave (900 MHz and above) range. Preferably the electromagnetic field is formed in a serpentine slotted waveguide.

Microwave frequency drying involves the heating of electrically non-conducting materials by a rapidly varying electromagnetic field. With respect to drying systems for sensitive fabrics, such as fiberglass fabrics for printed circuit board laminates, the use of microwave energy is believed to be previously unknown. Generally, microwave drying processes are generally not as cost-effective as other drying processes such as hot air, contact heat or infrared radiation. However, microwave drying is substantially cleaner and produces a higher quality of such specialty fabric as are used in substrates for electronic equipment. With microwave drying there is no pollution from gas or oil fired burners or electric heating elements. The reduced air volume that is required with microwave drying reduces air-based contaminants.

While RF drying achieves some of the desired results there are still some problems. As opposed to RF drying, microwave systems do not employ spaced electrodes. This eliminates any arcing through the fabric and the attendant problems. Furthermore, the drying is more uniform, drying efficiency is enhanced, and the equipment is less expensive. The electrical loss tangent for various finishes is more closely matched in the microwave region than in the RF region which means more compatible coupling with different finishes is realized.

It is an object of the present invention to more efficiently and effectively produce an improved woven glass fabric well suited for use as a reinforcing laminate for electronic applications. As in the case of RF dryers, the use of a microwave dryer eliminates the need for accumulators in the process. Accumulators are used in conventional fabric drying operations to facilitate continuous running and avoid stopping the dryer. Neither entrance nor exit accumulators are necessary with RF or microwave dryers. Accumulators are a chronic source of fabric distortion due to alignment difficulties. It is easier to handle fragile, lightweight fabrics when the accumulators are removed from the process. Moreover, the associated problems of accumulators, such as alignment, are eliminated. The dryer can be quickly stopped without accumulators to avoid damage to the glass woven fabric.

DETAILED DESCRIPTION OF THE PREFERRED EMBODIMENT

Figure 1:
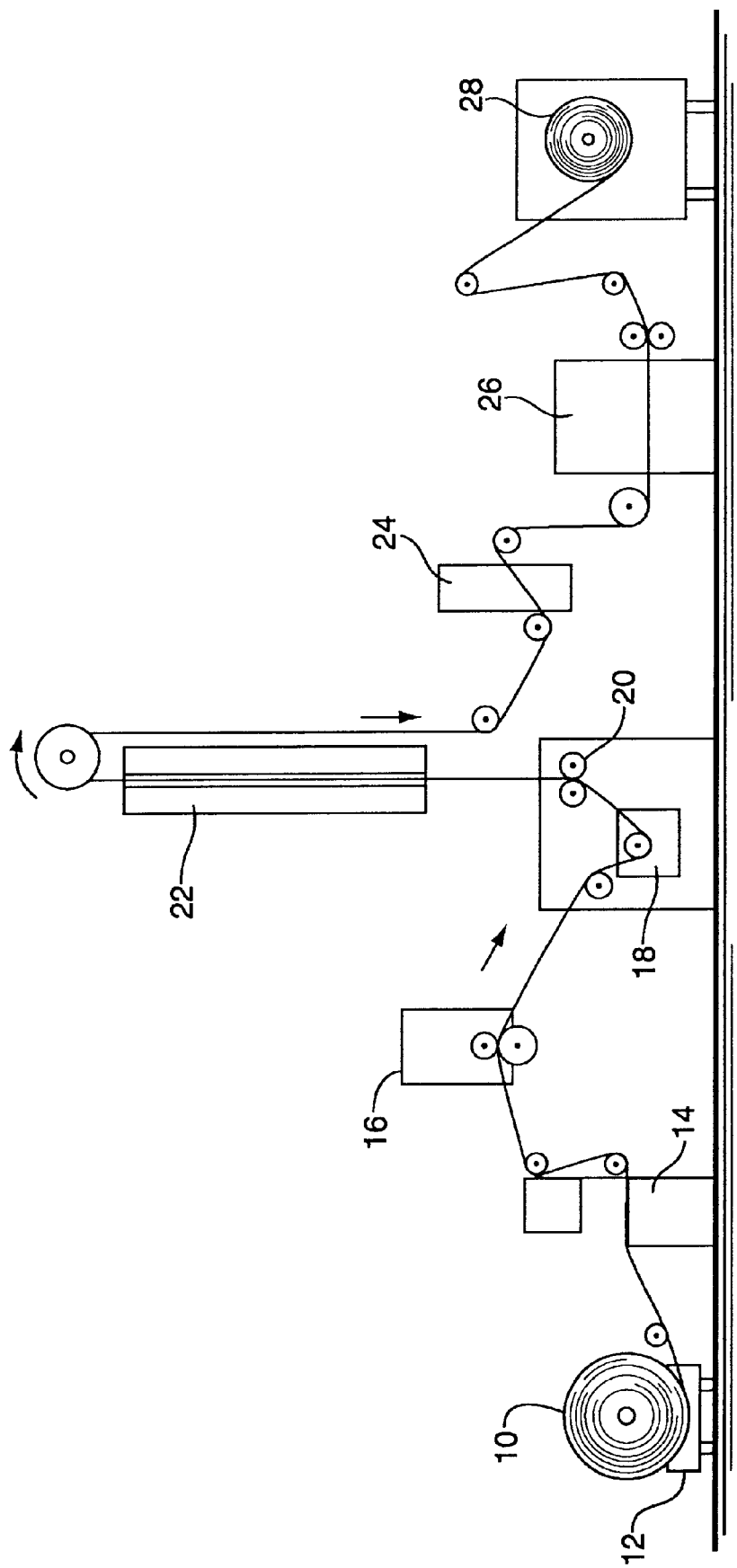
FIG. 1 is a schematic representation of the method of the present invention.

FIG. 1 represents a schematic drawing of the method of the present invention. All equipment is preferably enclosed within a Plexiglas or other suitable enclosure with a positive air pressure filtered atmosphere maintained.

Woven glass fabric 10 is supported on a mandrel 12. The fabric 10 preferably is initially placed in a batch oven (not shown) for heat cleaning. The fabric 10 is seamed by a thermal splicer 14 to provide a continuous supply. A draw roll assembly 16 pulls the fabric 10 from mandrel, 2 and controls the tension in the unit. Thereafter, the fabric 10 is immersed in an application pad box 18 where it is completely saturated in an aqueous based finish solutions.

Although different types of finish solution may be used, the preferred finish solution is a silane coupling agent of less than 1% concentration. The fabric 10 is then subjected to squeeze rolls 20 to remove the excess finish solution. The wet fabric 10, which exhibits an approximately 40% wet pick up, is subjected to heating in an microwave dryer 22 where it is "completely dried." The term "completely dried" as used herein means fabrics having less than 0.1% moisture content. Depending on the fabric style, the wet pick up may be between about 20% to 50%.

During the drying process the fabric is preferably moving in substantially a vertical direction. Thus, if tension is lost in the fabric as it travels vertically, the fabric will not sag onto the walls of the dryer 22.

The preferred microwave dryer is believed to be a 100 KW system which system includes a generator with a nominal operating frequency of about 915 MHz. The generator requires 480V, 60 Hz and has a maximum output of 100 KW. Further, the generator operates with self-contained dust-tight cool air circulation to maintain component ratings and reliability.

Figure 2:
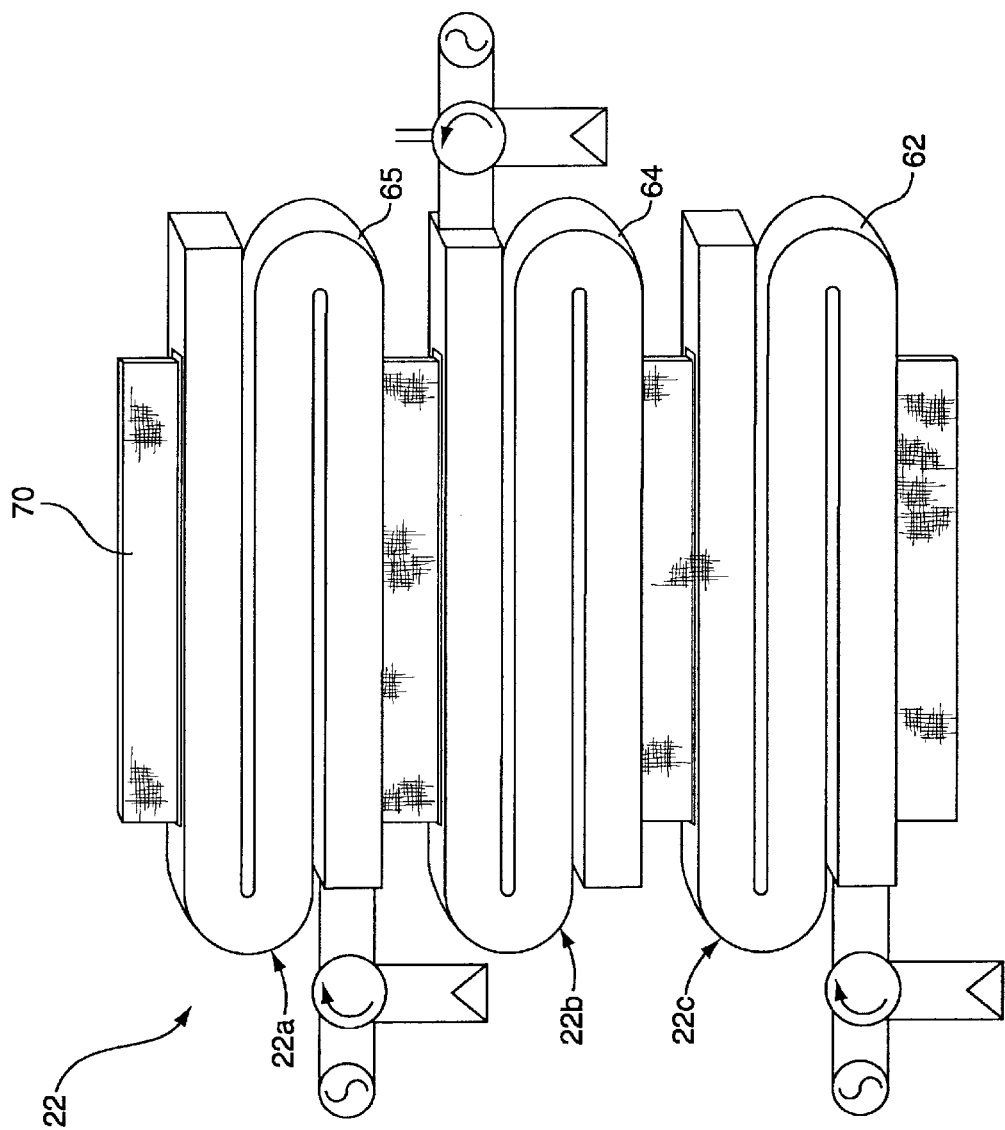
FIG. 2 is a schematic illustration of a typical microwave dryer incorporating the present invention.
Figure 3:
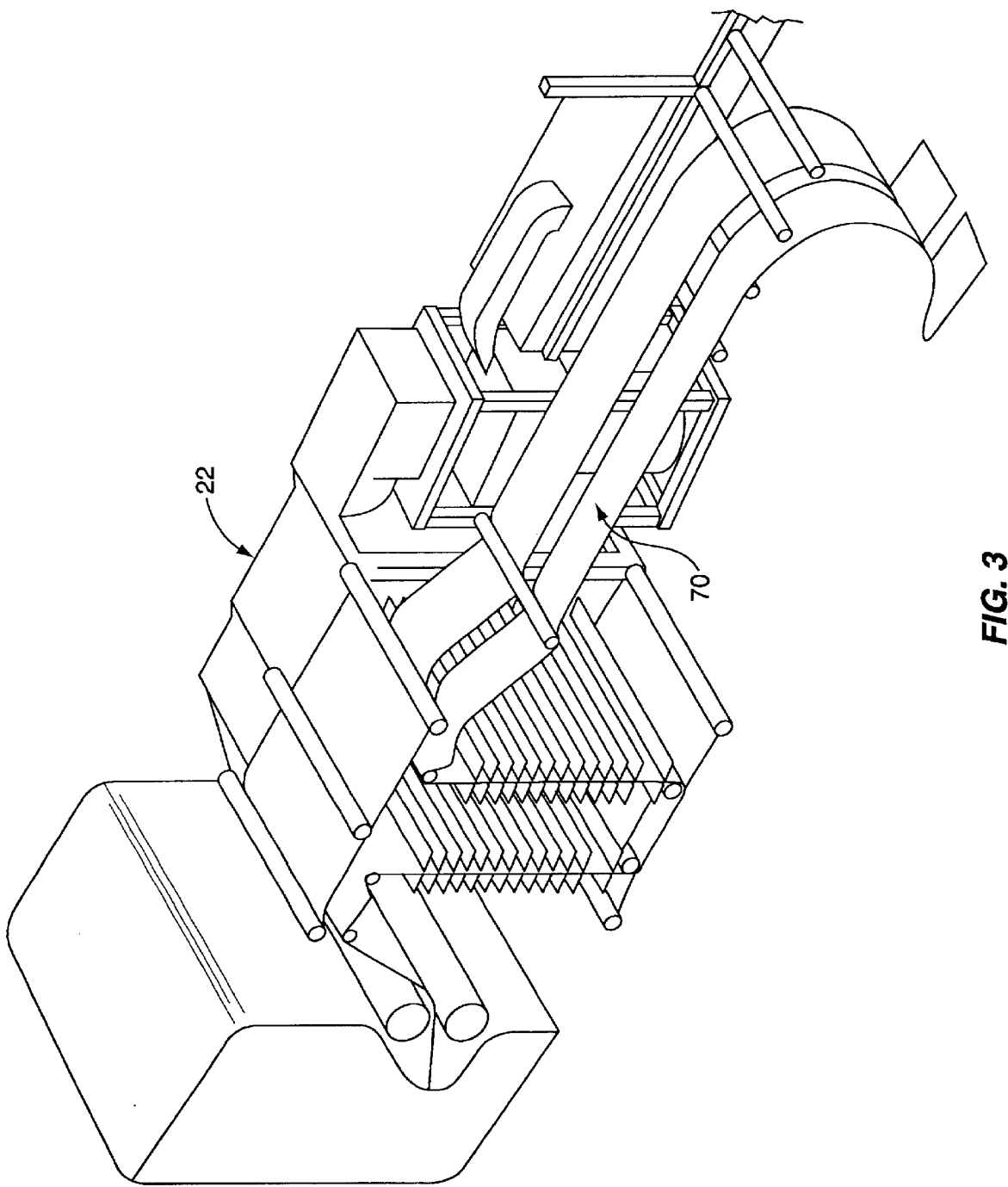
FIG. 3 is an illustration similar to FIG. 2 except showing a double pass, vertically oriented system.
Figure 4:
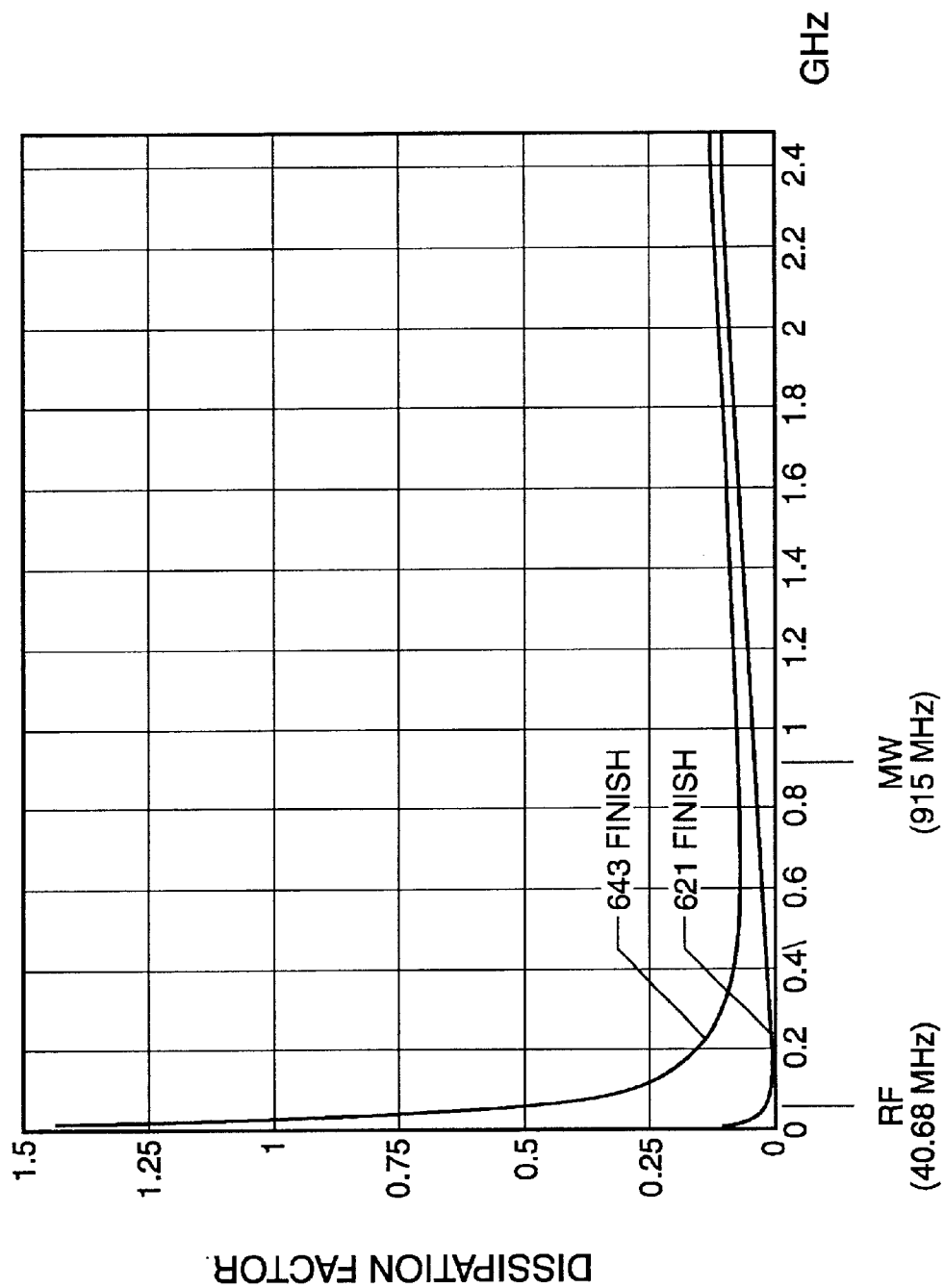
FIG. 4 is a graph of electric loss tangents of two different finishes when subjected to electromagnetic energy.

In FIG. 2, there is schematically illustrated a single pass, vertically oriented microwave applicator 22 that includes a plurality of serpentine slotted waveguides (processing stages) 22a, 22b, 22c. Each stage is made up of spaced guide members 62, 64, 66, each of which may be serpentine in shape. While a single pass applicator is illustrated, the applicator might be a double pass setup to increase production speed (see FIG. 3). The drying zone is configured to accept a 62 inch web 70 with a ±3 inch tracking wander. Other sizes of dryers and frequencies however may be used.

After drying, the fabric 10 is subjected to a vacuum unit 24 that removes remaining lint and fibers from the dried fabric 10. Preferably, an inspection is completed on-line with automatic inspection equipment 26. The clean, dried fabric 10 is then taken up in a finished roll 28.

The term "clean" is used to define fabric that has undergone the lamination process and passes magnified optical inspection. For example, the fabric is laminated with an epoxy resin and is copper clad. Thereafter, a circuit pattern is etched onto the laminate. The board is then optically inspected under magnification. If particulate matter is detected the laminate is marked. A clean laminate, therefore, is one substantially free of particulate matter.

To test the microwave system samples of woven glass fabric style 1080, (1.4 ounces/sq. yd.) were subjected microwave energy at a frequency of 915 MHz. The samples went 50 inches wide. The following table represents arbitrary production specifications chosen to simulate the microwave drying procedure.

TABLE I

| A. Production speed | 60 Yd/min. |
| --- | --- |
| B. Length of Waveguide Field | 8 ft. |
| C. Dwell time (B/A) | 2.67 sec. |

The effective dwell time is dependent upon the desired production speed, the length of the waveguide field, and the power input. Moreover, the speed required for stimulation is dependent upon the dwell time and the array length in the test unit. All samples showed acceptable levels of non-contamination. In the samples run the samples had been subjected to squeeze rolls and contained approximately a 30% wet pick-up. After processing through the test unit, the samples showed less than 0.1% moisture content. It is therefore believed that microwave drying will result in the extraction of 40% more moisture for the same time interval in the same size dryer.

To determine the level of foreign particles on woven glass fabrics dried with hot air, 10 samples were tested using a Teknek DCR12 Dust Cleaning Roller and Teknek DCR Pads. The DCR Roller was cleaned by rolling over the DCR Pad before each use. The cleaned DCR Roller was held against moving woven glass fabric either on a take-up roll or opposite a steel roller on a finishing unit or inspection frame. The DCR Roller ran in contact with the fabric for approximately 30 linear feet, calculated by a timed interval (seconds required=600/yards per minute). Immediately thereafter, a new DCR Pad was uncovered and the DCR Roller was rolled over the new Pad. The Pad was then covered with a sheet of overhead transparency film.

Using a 5" diameter fluorescent magnifier work lamp at a distance of approximately 12" to 14" the DCR Pad was inspected with all visible particles being circled. The number of circles were counted and recorded as particles per 30 sq./ft/of glass fabric surface. Using hot air as the method for drying the fabric, levels from 25 to 84 particles per 30 sq. ft. remained on the fabric. This level of particulate matter is unacceptable for sensitive electronic equipment laminates.

It is estimated that microwave drying according to the present invention will result in at least a 70% reduction in foreign particles as compared to previous methods of drying, such as hot air. This shows an equivalent result to RF drying but with more efficiency.

The foregoing has described a substrate material and its method of manufacture by which the quality of woven glass fabric and, thus, the quality of circuit boards themselves can be significantly improved. Drying the woven glass substrate fabric by dielectric heating results in a significantly cleaner fabric. When the dietective heating is in the microwave range it is more efficient and more effective.

One of the advantages of the microwave drying over drying in the RF range is that in microwave drying no electromagnetic field is formed between opposing electrodes in the drying chamber. Rather, microwaves are generated remotely by a magnatron, and the microwave energy is delivered to the drying chamber by aluminum ductwork called "wave guides." Any arcing that occurs with microwave occurs along the surface of the chamber or wave guide, but not through the material. Also, microwave systems do not require tuning or mechanical adjustments of the electrode spacing between types of finishes being run, so that a variety of different finishes can be run more easily.

Another advantage of microwave energy is that "wave guides" are highly efficient with no significant loss of energy. As a result the microwave generator can be located in a remote area of the plant where it can be easily serviced, and does not necessarily need to be close to the finishing unit.

A more uniform drying of the product can be achieved by microwave drying, which prevents migration of the finish and concentration differences. Difference in finish concentration can adversely effect the printed circuit board properties.

Microwave drying is approximately 10% more efficient than drying by the much lower radio frequency energy. Further, ovens of the same size can accommodate approximately 33% more power from microwave generators than from RF generators. With the 10% higher efficiency and 33% more power, it is expected that an increase in drying capacity and/or speed in the range of 40% may be realized.

Testing shows that, while there is a significant difference between finishes in the electrical loss tangent at the 40 MHz frequency region, the loss tangent at 915 MHz is much more consistent between finishes. See the graph of FIG. 2.

While the invention has been particularly shown and described with reference to a preferred embodiment thereof, it will be understood by those skilled in the art that various changes in form and details may be made therein without departing from the spirit and scope of the invention.

I claim:

1. A method for drying woven glass fabric comprising the step of subjecting the fabric to heating in a microwave energy field.

2. The method of claim 1 wherein the frequency is at least 900 MHz.

3. The method of claim 2 wherein the frequency tolerance is ±0.05%.

4. The method of claim 1 wherein the fabric is subjected to microwave energy in a waveguide field for an effective dwell time based on a production speed and the length of the waveguide field.

5. The method of claim 4 wherein the fabric achieves a final moisture content of less than 0.1% by weight after drying.

6. The method of claim 1 wherein the microwave energy is channeled by a slotted waveguide.

7. The method according to claim 6 wherein the slotted waveguide is serpentine in shape.

8. A method for drying woven glass fabric intended for use as a reinforcing laminate in printed circuit boards comprising the steps of:

a) immersing the fabric in an aqueous-based finishing solution having a silane coupling agent of less than 1% concentration;

b) passing the fabric through squeeze rolls to attain a moisture content of approximately between 20% and 50% wet pick up; and c) subjecting the fabric to a microwave energy field until the moisture content is reduced to no greater than 0.1%.

9. The method of claim 8 wherein the microwave energy field is formed by a slotted waveguide.

10. The method according to claim 9 wherein the slotted waveguide is serpentine in shape.

* * * * *